United States Patent
Horikawa

(10) Patent No.: US 6,563,182 B2
(45) Date of Patent: May 13, 2003

(54) SEMICONDUCTOR DEVICE AND MANUFACTURING METHOD THEREOF

(75) Inventor: Tsuyoshi Horikawa, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/954,021

(22) Filed: Sep. 18, 2001

(65) Prior Publication Data

US 2002/0135030 A1 Sep. 26, 2002

(30) Foreign Application Priority Data

Mar. 22, 2001 (JP) ........................................ 2001-082614

(51) Int. Cl.[7] .......................................... H01L 31/119
(52) U.S. Cl. ..................... 257/405; 257/402; 257/392; 257/410
(58) Field of Search ................................ 257/402, 405, 257/406, 407, 392, 295, 410, 411

(56) References Cited

U.S. PATENT DOCUMENTS 5,923,056 A * 7/1999 Lee et al. ................... 257/192
6,054,357 A * 4/2000 Choi ........................... 257/405
6,174,974 B1 * 1/2001 Gardner et al. ............. 502/152

FOREIGN PATENT DOCUMENTS

| JP | 01206669 A | * | 8/1989 | ........... H01L/27/08 |
| JP | 3-46267 | | 2/1991 | |
| JP | 6-61437 | | 3/1994 | |
| JP | 11-297867 | | 10/1999 | |
| JP | 2000-174135 | | 6/2000 | |

* cited by examiner

*Primary Examiner*—Eddie Lee
*Assistant Examiner*—Matthew C. Landau
(74) *Attorney, Agent, or Firm*—Oblon, Spivak, McClelland, Maier & Neustadt, P.C.

(57) ABSTRACT

Second insulating films of gate insulating films each are composed of a high-permittivity dielectric film having a relative dielectric constant of 8 or more and at least one of the high-permittivity dielectric films constituting the second insulating films is doped with at least one kind of impurity metal ions. The valence number of the impurity metal ions differs by 1 from that of metal ions constituting the high-permittivity dielectric films. Due to this doping, at least one of the density and polarity of charged defects in the high-permittivity dielectric films differs between the second insulating films. The threshold voltage of each MISFET is controlled independently.

12 Claims, 5 Drawing Sheets

| DOPANT | CONCENTRATION (atom%) | THRESHOLD VALUE OF nMOSFET(V) | THRESHOLD VALUE OF pMOSFET(V) |
|---|---|---|---|
| NONE | — | 0.32 | −0.61 |
| Sr | 0.03 | 0.33 | −0.60 |
| Sr | 0.10 | 0.36 | −0.57 |
| Sr | 0.3 | 0.42 | −0.51 |
| Sr | 1 | 0.54 | −0.39 |
| Sr | 3 | 0.70 | −0.23 |
| Sr | 10 | 0.71 | −0.22 |

| DOPANT | CONCENTRATION (atom%) | THRESHOLD VALUE OF nMOSFET(V) | THRESHOLD VALUE OF pMOSFET(V) |
|---|---|---|---|
| NONE | — | 0.32 | −0.61 |
| Zr | 0.03 | 0.31 | −0.62 |
| Zr | 0.10 | 0.28 | −0.65 |
| Zr | 0.3 | 0.22 | −0.71 |
| Zr | 1 | 0.10 | −0.83 |
| Zr | 3 | −0.05 | −0.96 |
| Zr | 10 | −0.06 | −0.97 |

FIG. 5

| DOPANT | CONCENTRATION (atom%) | THRESHOLD VALUE OF nMOSFET(V) | THRESHOLD VALUE OF pMOSFET(V) |
|---|---|---|---|
| NONE | — | 0.46 | −0.49 |
| Y | 0.03 | 0.47 | −0.48 |
| Y | 0.10 | 0.49 | −0.47 |
| Y | 0.3 | 0.55 | −0.40 |
| Y | 1 | 0.68 | −0.24 |
| Y | 3 | 0.80 | −0.10 |
| Y | 10 | 0.80 | −0.09 |

FIG. 6

| DOPANT | CONCENTRATION (atom%) | THRESHOLD VALUE OF nMOSFET(V) | THRESHOLD VALUE OF pMOSFET(V) |
|---|---|---|---|
| NONE | — | 0.46 | −0.49 |
| Ta | 0.03 | 0.45 | −0.49 |
| Ta | 0.10 | 0.39 | −0.56 |
| Ta | 0.3 | 0.35 | −0.62 |
| Ta | 1 | 0.26 | −0.70 |
| Ta | 3 | 0.10 | −0.86 |
| Ta | 10 | 0.09 | −0.85 |

SEMICONDUCTOR DEVICE AND MANUFACTURING METHOD THEREOF

BACKGROUND OF THE INVENTION

1. Field of the Invention

The present invention relates to a semiconductor device, and especially to a technique for independently controlling the threshold voltages of a plurality of MIS (metal insulator semiconductor) field-effect transistors (hereinafter referred to as "MISFETs") comprised in a semiconductor device.

2. Description of the Background Art

FIG. 9 illustrates a schematic cross-sectional view of a conventional semiconductor device 1P. The semiconductor device 1P is a basic CMOS (complementary MOS) device comprising both an n-channel MOS (metal oxide semiconductor) field-effect transistor (hereinafter referred to as an "nMOSFET") 10P and a p-channel MOSFET (hereinafter referred to as a "pMOSFET") 30P. Such a semiconductor device 1P is disclosed for example in Japanese Patent Application Laid-open No. 6-61437 (1994), FIG. 6.

As shown in FIG. 9, a semiconductor substrate 2P is divided into active regions by an isolation oxide film 3P. A p-well 11P for the nMOSFET 10P is formed in one of the active regions of the semiconductor substrate 2P, whereas an n-well 31P for the pMOSFET 30P is formed in another active region adjacent to the above one.

In the surface of the p-well 11P, a pair of n-type impurity layers 12P and 13P are formed with a channel region sandwiched in between. A gate insulating film 14P composed of a silicon oxide film such as a thermal oxide film is formed on the channel region in the p-well 11P and a gate electrode 15P is formed on the gate insulating film 14P.

Similarly, in the surface of the n-well 31P, a pair of p-type impurity layers 32P and 33P are formed with a channel region sandwiched in between. A gate insulating film 34P composed of a silicon oxide film such as a thermal oxide film is formed on the channel region in the n-well 31P and a gate electrode 35P is formed on the gate insulating film 34P.

For low resistance, the gate electrodes 15P and 35P are doped with impurities such as phosphorus or boron by ion implantation or the like.

An interlayer insulation film 4P is formed over the whole surface of the semiconductor substrate 2P to cover the gate electrodes 15P and 35P. The interlayer insulation film 4P has formed therein contact holes which connect the impurity layers 12P, 13P, 32P, and 33P to wires 17P, 18P, 37P, and 38P, respectively.

For example when the gate electrodes 15P and 35P are doped with phosphorus, due to (the presence or absence of) the work function difference between the gate electrodes 15P, 35P and their opposing channel regions, the following operating discrepancy arises between the nMOSFET 10P and the pMOSFET 30P.

In the nMOSFET 10P, since the gate electrode 15P is formed on the p-well 11P, a positive work function difference $\Delta\Phi f$ with respect to the p-well 11P (or the substrate 2P) arises between the gate electrode 15P and the p-well 11P. Accordingly, the energy band in the vicinity of the channel bends downwardly when the potential of the gate electrode 15P is equal to the substrate potential. From this, an inversion layer can be formed by slightly applying a positive potential to the gate electrode 15P.

In the pMOSFET 30P, on the other hand, since the gate electrode 35P is formed on the n-well 31P, no work function difference with respect to the substrate 2P arises between the phosphorus-doped n-type gate electrode 35P and the n-well 31P. Thus, the energy band in the vicinity of the channel is almost flat when the potential of the gate electrode 35P is equal to the substrate potential. From this, for formation of an inversion layer in the pMOSFET 30P, the gate electrode 35P must be set at a fairly high negative potential. That is, the threshold voltage (hereinafter also referred to as a "threshold value") is increased.

When both the gate electrodes 15P and 35P are doped with the same type of impurity, the threshold voltages of the nMOSFET 10P and the pMOSFET 30P are determined by the work function differences between the gate electrodes 15P, 35P and their opposing channel regions. That is, the conventional semiconductor device 1P has difficulty in controlling the threshold values of the nMOSFET 10P and the p-MOSFET 30P to the proper values.

As a measure to resolve such a problem, there is a method for independently controlling the threshold values of the MOSFETs 10P and 30P by doping the gate electrode 15P of the nMOSFET 10P with phosphorus and doping the gate electrode 35P of the pMOSFET 30P with boron.

The boron implanted in the gate electrode 35P will, however, diffuse (penetrate) into the channel region in a subsequent thermal treatment process and therefore it may cause problems such as an unintentional threshold-voltage increase. In next-generation MOSFETs, since a thin silicon oxide film of about 2 nm or less is used for the gate insulating film 34P, the above boron penetration is more likely to occur and thus changes in MOSFET characteristics are taken as an important issue.

Other examples of the methods for independently controlling the threshold values of the MOSFETs 10P and 30P include adjustment of the amount of dopant in the channel region and doping of the channel region with a counter impurity. However, such methods cause a considerable change in the impurity concentration of the channel region, resulting in characteristic deterioration such as an increase in channel leakage. Therefore, it is difficult to accomplish a dramatic threshold voltage shift, and the like.

In a system LSI, for specifications reasons, MOSFETs for logic circuit, MOSFETs for memory cell, and MOSFETs for I/O circuit often have different threshold voltages. In such a case, also, the aforementioned difficulty in controlling the threshold voltages becomes an issue.

SUMMARY OF THE INVENTION

A first aspect of the present invention is directed to a semiconductor device comprising: a semiconductor substrate; a first MISFET including a first gate insulating film formed on the semiconductor substrate; and a second MISFET including a second gate insulating film formed on the semiconductor substrate, wherein the first gate insulating film includes, at least in part, a first dielectric film containing first metal ions and having a relative dielectric constant of 8 or more, the second gate insulating film includes, at least in part, a second dielectric film containing second metal ions and having a relative dielectric constant of 8 or more, first doping is performed on the first dielectric film using at least one kind of first impurity metal ions whose valence number differs by 1 from that of the first metal ions, and/or second doping is performed on the second dielectric film using at least one kind of second impurity metal ions whose valence number differs by 1 from that of the second metal ions, and wherein due to the first and/or second doping, at least one of the density and polarity of charged defects differs between the first dielectric film and the second dielectric film.

According to a second aspect of the present invention, in the semiconductor device of the first aspect, the first dielectric film and the second dielectric film are made of the same material.

According to a third aspect of the present invention, in the semiconductor device of the second aspect, the first MISFET includes an n-channel MISFET, the second MISFET includes a p-channel MISFET, the at least one kind of first impurity metal ions includes third metal ions having a valence number greater than the first metal ions, the at least one kind of second impurity metal ions includes fourth metal ions having a valence number greater than the second metal ions, and when the first doping and the second doping are both performed, a concentration of the third metal ions is set to be not less than that of the fourth metal ions.

According to a fourth aspect of the present invention, in the semiconductor device of either the second or the third aspect, the first MISFET includes an n-channel MISFET, the second MISFET includes a p-channel MISFET, the at least one kind of first impurity metal ions includes fifth metal ions having a valence number smaller than the first metal ions, the at least one kind of second impurity metal ions includes sixth metal ions having a valence number smaller than the second metal ions, and when the first doping and the second doping are both performed, a concentration of the fifth metal ions is set to be not more than that of the sixth metal ions.

According to a fifth aspect of the present invention, in the semiconductor device of the second aspect, the first and second MISFETs include MISFETs of the same channel type, the at least one kind of first impurity metal ions includes third metal ions having a valence number greater than the first metal ions, the at least one kind of second impurity metal ions includes fourth metal ions having a valence number greater than the second metal ions, and when the first doping and the second doping are both performed, a concentration of the third metal ions is set to be not less than that of the fourth metal ions.

According to a sixth aspect of the present invention, in the semiconductor device of either of the second through fifth aspects, the first and second MISFETs include MISFETs of the same channel type, the at least one kind of first impurity metal ions includes fifth metal ions having a valence number smaller than the first metal ions, the at least one kind of second impurity metal ions includes sixth metal ions having a valence number smaller than the second metal ions, and when the first doping and the second doping are both performed, a concentration of the fifth metal ions is set to be not more than that of the sixth metal ions.

According to a seventh aspect of the present invention, in the semiconductor device of either of the first through sixth aspects, materials of the first and second dielectric films each include at least one of $Al_2O_3$, $Y_2O_3$, and $La_2O_3$, and the at least one kind of first impurity ions and the at least one kind of second impurity ions each include at least one of bivalent ions including Ba, Sr, Mg and Ca ions, and quadrivalent ions including Ti, Zr, Hf, Si, and Pr ions.

According to an eighth aspect of the present invention, in the semiconductor device of either of the first through sixth aspects, materials of the first and second dielectric films each include at least one of $TiO_2$, $ZrO_2$, $HfO_2$, and $PrO_2$, and the at least one kind of first impurity metal ions and the at least one kind of second impurity metal ions each include at least one of trivalent ions including Al, Y and La ions, and quinquevalent ions including Ta and Nb ions.

According to a ninth aspect of the present invention, in the semiconductor device of either of the first through eighth aspects, a dopant concentration of the at least one kind of first and/or second impurity metal ions is in the range of 0.1 atomic % to 10 atomic %.

A tenth aspect of the present invention is directed to a method of manufacturing the semiconductor device of either of the first through ninth aspects, the method comprising the steps of: (a) preparing the semiconductor substrate; and (b) forming the first and second dielectric films, wherein the step (b) includes the step of: (b-1) performing first and/or second doping by using at least one of a MOCVD and an ion implantation methods.

According to an eleventh aspect of the present invention, in the method of manufacturing a semiconductor device according to the tenth aspect, the first and/or second doping is performed by the MOCVD method, and an organic metal used as a supply source of the at least one kind of first impurity metal ions and/or the at least one kind of second impurity metal ions contains a common organic ligand with an organic metal used as a supply source of the first and/or second metal ions.

A twelfth aspect of the present invention is directed to a semiconductor device comprising: a semiconductor substrate; a first MISFET including a first gate insulating film formed on the semiconductor substrate; and a second MISFET including a second gate insulating film formed on the semiconductor substrate, wherein the first gate insulating film includes, at least in part, a first dielectric film containing predetermined metal ions and having a relative dielectric constant of 8 or more, the second gate insulating film includes, at least in part, a second dielectric film, doping is performed on the first dielectric film using at least one kind of impurity metal ions whose valence number differs by 1 from that of the predetermined metal ions, and wherein a threshold voltage difference between the first MISFET and the second MISFET is accomplished by controlling at least one of the density and polarity of charged defects caused by the doping in the first dielectric film.

According to the first aspect of the present invention, since the density and/or polarity of charged defects due to doping differs between the first and second dielectric films, the first and second dielectric films can be in different charged states. Thus, even if the gate electrodes of the first and second MISFETs are made of the same material, it is possible to independently control the state of the energy band of the semiconductor substrate in the vicinity of the first gate insulating film and the same in the vicinity of the second insulating film. Accordingly, the threshold voltages of the first and second MISFETs can be controlled independently. At this time, in the semiconductor device, boron penetration in the gate electrodes (of polycrystalline silicon) and channel leakage due to doping of the channel regions of the MISFETs are suppressed, as compared with those in conventional semiconductor devices. Therefore, as compared with conventional semiconductor devices, the semiconductor device can control the threshold voltage of the first MISFET over a wider voltage range with greater accuracy (while inhibiting unintentional threshold voltage shifts).

According to the second aspect of the present invention, the semiconductor device can be manufacture more simply than would be possible if the first and second dielectric films are made of different materials.

According to the third aspect of the present invention, when the n-channel and p-channel MISFETs constitute a CMOS, for example, consistency can be achieved between the threshold values of both the MISFETs. In addition, the threshold voltage of the n-channel MISFET can be reduced.

According to the fourth aspect of the present invention, when the n-channel and p-channel MISFETs constitute a CMOS, for example, consistency can be achieved between the threshold values of both the MISFETs. In addition, the threshold voltage of the p-channel MISFET can be reduced.

According to the fifth aspect of the present invention, the first and second MISFETs of the same channel type can have different threshold voltages. This enables the provision of a semiconductor device which comprises, for example, both MISFETs for logic circuit having a low threshold voltage and MISFETs for I/O circuit having a high threshold voltage.

According to the sixth aspect of the present invention, the first and second MISFETs of the same channel type can have different threshold voltages. This enables the provision of a semiconductor device which comprises, for example, both MISFETs for logic circuit having a low threshold voltage and MISFETs for I/O circuit having a high threshold voltage.

According to the seventh aspect of the present invention, a semiconductor device can be provided which is capable of independently controlling the threshold voltages of the first and second MISFETs.

According to the eighth aspect of the present invention, a semiconductor device can be provided which is capable of independently controlling the threshold voltages of the first and second MISFETs.

According to the ninth aspect of the present invention, charged defects can be generated which can considerably vary the threshold voltages of the MISFETs.

According to the tenth aspect of the present invention, a good-quality, impurity-doped first and/or dielectric film can be formed.

According to the eleventh aspect of the present invention, a side reaction between the ligands of the organic metals can be inhibited, which allows film formation with a high degree of reproducibility.

According to the twelfth aspect of the present invention, a difference in threshold voltage can be produced between the first and second MISFETs by controlling at least one of the density and polarity of charged defects due to doping of the first dielectric film. At this time, the threshold voltage difference between the first and second MISFETs can be easily produced by controlling the density and/or polarity of charged defects in the first dielectric film. Also, in the semiconductor device, boron penetration in the gate electrodes (of polycrystalline silicon) and channel leakage due to doping of the channel regions of the MISFETs are suppressed, as compared with those in conventional semiconductor devices. Therefore, as compared with conventional semiconductor devices, the semiconductor device can control the threshold voltage of the first MISFET over a wider voltage range with greater accuracy (while inhibiting unintentional threshold voltage shifts).

An object of the present invention is to provide a semiconductor device which comprises a plurality of MISFETs each having an independently controlled threshold voltage.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 are explanatory diagrams of the relationship between the concentration of impurity metal ions in a gate insulating film and the threshold voltages of MOSFETs in the semiconductor device of the second preferred embodiment;

DESCRIPTION OF THE PREFERRED EMBODIMENTS

<First Preferred Embodiment>

Figures 1, 2:
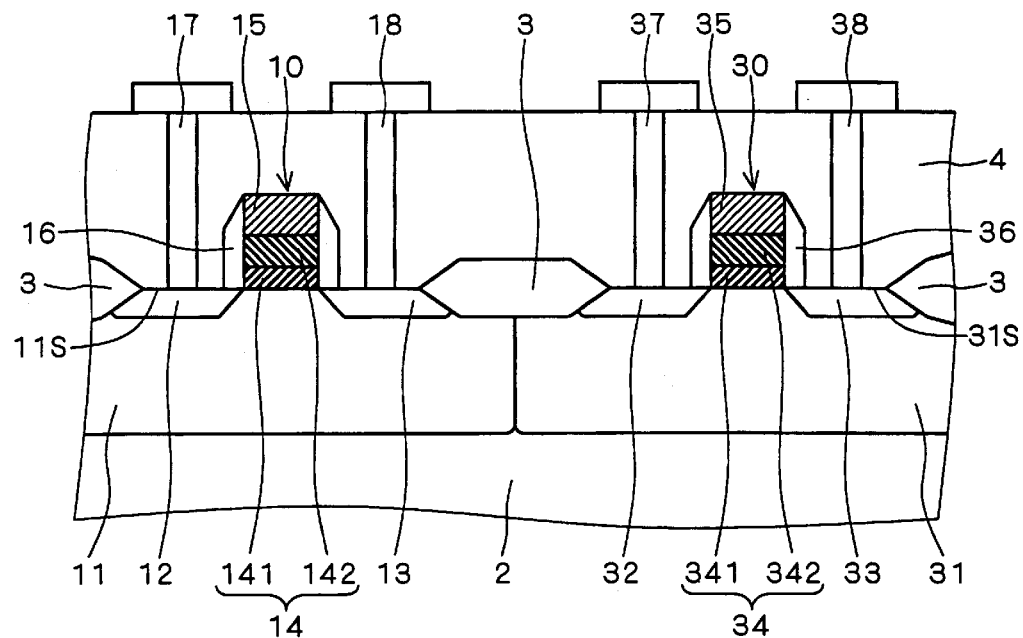
FIG. 1 is a schematic cross-sectional view of a semiconductor device according to a first preferred embodiment.
FIGS. 2 and 3 are explanatory diagrams of the relationship between the concentration of impurity metal ions in a second insulating film of a gate insulating film and the threshold voltages of MOSFETs in the semiconductor device of the first preferred embodiment.

FIG. 1 illustrates a schematic cross-sectional view of a semiconductor device 1 according to a first preferred embodiment. The semiconductor device 1 is a basic CMOS (complementary MOS) device which comprises both an n-channel MOS (metal oxide semiconductor) field-effect transistor (hereinafter referred to as an "nMOSFET") and a p-channel MOSFET (hereinafter referred to as a "pMOSFET"). The semiconductor device 1 constitutes a CMOS inverter, for example.

As shown in FIG. 1, the semiconductor device 1 comprises a semiconductor substrate (hereinafter simply referred to as a "substrate") 2 composed for example of silicon, and an nMOSFET (or first MISFET) 10 and a pMOSFET (or second MISFET) 30 which are incorporated in the substrate 2. More specifically, the substrate 2 is divided into active regions by an isolation oxide film 3. In one of the active regions of the substrate 2, a p-well 11 for the nMOSFET 10 is formed to a predetermined depth from the main surface (or surface) of the substrate 2. In another active region adjacent to the above one, an n-well 31 for the pMOSFET 30 is formed to a predetermined depth from the surface of the substrate 2.

In the following description, a portion of the surface of the substrate 2 where the p-well 11 is formed is also referred to as a surface 11S of the p-well 11 and a portion where the n-well 31 is formed as a surface 31S of the n-well 31.

In the surface 11S of the p-well 11, a pair of n-type impurity layers 12 and 13 are formed, sandwiching a region for formation of a channel of the nMOSFET 10 (channel region) in between. The impurity layers 12 and 13 form source/drain regions of the nMOSFET 10. On the channel region in the surface 11S of the p-well 11, a gate insulating film (or first gate insulating film) 14 and a gate electrode 15 for the nMOSFET 10 are formed in this order. Especially in the semiconductor device 1, as will be discussed later, the gate insulating film 14 of the nMOSFET 10 includes a first insulating film 141 and a second insulating film 142. Further, sidewall spacers 16 for the nMOSFET 10 are formed in contact with the side surfaces of the gate insulating film 14 and the gate electrode 15 and with the surface 11S of the p-well 11.

In the surface 31S of the n-well 31, on the other hand, a pair of p-type impurity layers 32 and 33 are formed with a channel region of the pMOSFET 30 sandwiched in between. The impurity layers 32 and 33 form source/drain regions of the pMOSFET 30. On the channel region in the surface 31S of the n-well 31, a gate insulating film (or second gate insulating film) 34 and a gate electrode 35 are formed in this order. Especially in the semiconductor device 1, as will be discussed later, the gate insulating film 34 of the pMOSFET 30 includes a first insulating film 341 and a second insulating film 342. Further, sidewall spacers 36 for the pMOSFET 30 are formed in contact with the side surfaces of the gate insulating film 34 and the gate electrode 35 and with the surface 31S of the n-well 31.

The gate electrodes 15 and 35 are composed of phosphorus- or boron-doped polycrystalline silicon, or a metal such as W, Al, Cu, Co, Ti or Pt, or a metal silicide or nitride of such a metal. In another alternative, the gate electrodes 15 and 35 may be formed of multiple layers of such materials.

The semiconductor device 1 further comprises an interlayer insulation film 4 and wires 17, 18, 37, and 38. More specifically, the interlayer insulation film 4 is formed over the whole surface of the substrate 2 to cover the gate electrodes 15 and 35. The interlayer insulation film 4 has formed therein contact holes which connect the impurity layers 12, 13, 32 and 33 to the wires 17, 18, 37, and 38, respectively.

The gate insulating films 14 and 34, as above described, include the first insulating films 141, 341 and the second insulating films 142, 342, respectively. The semiconductor device 1, therefore, has a multilayered structure consisting of the first insulating films 141 and 341/the second insulating films 142 and 342/the gate electrodes 15 and 35, all of which are formed on the surfaces 11S and 31S of the wells 11 and 31.

The first insulating films 141 and 341 of the gate insulating films 14 and 34 are composed of dielectric films having a low (relative) dielectric constant (hereinafter referred to as "low-permittivity dielectric films") such as a silicon oxide film including a thermal oxide film, or a silicon nitride film, or a silicon oxynitride film which is a combination of the silicon oxide film and the silicon nitride film. The silicon oxide film (thermal oxide film), the silicon nitride film, and the silicon oxynitride film have relative dielectric constants of about 3.8, about 7.5, and about 4–7, respectively. The thicknesses of the first insulating films 141 and 341 are set to be not more than 3 nm, preferably 2 nm or less.

The second insulating films 142 and 342 of the gate insulating films 14 and 34, on the other hand, are primarily composed of dielectric films (or first and second dielectric films) having a (relative) dielectric constant (hereinafter referred to as "high-permittivity dielectric films") higher than the first insulating films 141 and 341. The thicknesses of the high-permittivity dielectric films, i.e., the second insulating films 42 and 342, are for example set to between 3 and 15 nm, preferably between 3 and 10 m. Especially, at least one of the high-permittivity dielectric films constituting the second insulating films 142 and 342 is doped with impurity metal ions (or first and second impurity metal ions) (first and second dopings).

In more detail, the high-permittivity dielectric films are made of any one of dielectrics such as $Al_2O_3$, $Y_2O_3$ and $La_2O_3$ or any mixture of at least two of them, for example. The dielectrics $Al_2O_3$, $Y_2O_3$ and $La_2O_3$ respectively contain Al, Y, and La ions which are trivalent metal ions (or first and second metal ions) and have the relative dielectric constants of about 8–10, about 13, and about 20, respectively. That is, the high-permittivity dielectric films contain predetermined metal ions and have the relative dielectric constant of 8 or more. Further, metal ions (or third and fourth metal ions) such as Ti, Zr, Hf, Si or Pr ions, which are in stable oxidation state when quadrivalent, and/or metal ions (or fifth and sixth metal ions) such as Ba, Sr, Mg or Ca ions, which are in stable oxidation state when bivalent, are used as impurity metal ions (dopant) implanted in the high-permittivity dielectric films such as $Al_2O_3$.

In another alternative materials for the high-permittivity dielectric films, any one of dielectrics such as $TiO_2$, $ZrO_2$, $HfO_2$ and $PrO_2$ or any mixture of at least two of them is used. The dielectrics $TiO_2$, $ZrO_2$, $HfO_2$ and $PrO_2$ respectively contain Ti, Zr, Hf, and Pr ions which are quadrivalent metal ions (or first and second metal ions) and have the relative dielectric constants of about 80, about 20, about 30, and about 15, respectively. Further, metal ions (or third and fourth metal ions) such as Ta or Nb ions, which are in stable oxidation state when quinquevalent, and/or metal ions (or fifth and sixth metal ions) such as Al, Y or La ions, which are in stable oxidation state when trivalent, are used as impurity metal ions (dopant) implanted in the high-permittivity dielectric films such as $TiO_2$.

In doping using the aforementioned impurity metal ions, the dopant concentration, as will be discussed later, is set to between 0.1 and 10 atomic % (at %), preferably between 0.3 and 3 at %. Doping in such low dopant concentrations will hardly change the relative dielectric constants of the high-permittivity dielectric films.

The high-permittivity dielectric films such as $Al_2O_3$ (before doping) are deposited for example by CVD (chemical vapor deposition) or sputtering. Or, they may be formed by first forming metal films (e.g., Al films) which constitute the high-permittivity dielectric films (e.g., $Al_2O_3$ films) by CVD or sputtering or forming nitride films of such metal (e.g., AlN films) by reactive sputtering, and then oxidizing the formed film.

The doping using impurity metal ions is performed by ion implantation, for example. Or, impurity-doped high-permittivity dielectric films may be directly formed by the CVD method (i.e., doping by CVD). At this time, when an MO (metal organic) CVD method is employed, it is desirable that an organic metal for use as a supply source of impurity metal ions should contain a common organic ligand with an organic metal for use as a supply source of metal ions constituting the high-permittivity dielectric films. In such a case, a side reaction between the ligands of the organic metals can be inhibited, which permits film formation with a high degree of reproducibility. In another alternative, impurity-doped high-permittivity dielectric films may be directly formed by sputtering using a target containing impurity metal ions. Or, doping may be performed on the aforementioned metal films or nitride films which are to be high-permittivity dielectric films by oxidation. At this time, doping may be performed by a combination of ion implantation and MOCVD. Such doping by ion implantation and/or MOCVD can produce a good-quality, impurity-doped high-permittivity dielectric film.

The high-permittivity dielectric films can be patterned by well-known techniques such as photolithography and (dry or wet) etching.

In the impurity-doped high-permittivity dielectric films, impurity metal ions enter into sites of metal ions constituting the high-permittivity dielectric film. That is, metal ions constituting the high-permittivity dielectric films are replaced with impurity metal ions. Since the impurity metal ions have a valence number which differs by 1 from that of the metal ions constituting the high-permittivity dielectric films, in the high-permittivity dielectric films, charge neutrality is locally violated and an electric charge occurs (the occurrence of charged defects (charged defect centers)). More specifically, when the metal ions constituting the high-permittivity dielectric films are replaced with impurity metal ions having a smaller valence number, the high-permittivity dielectric films are locally charged negative, whereas when the metal ions are replaced with impurity metal ions having a greater valence number, the high-permittivity dielectric films are locally charged positive. In other words, doping with impurity metal ions having a smaller valence number produces negatively charged defects, whereas doping with those having a greater valence number produces positively charged defects. At this time, since doping in low concentrations as above described hardly causes a change in oxide defect density in the high-permittivity dielectric films, the total amount (or the degree) of electric charge on the high-permittivity dielectric films, i.e., on the second insulating films 142 and 342, is governed by the amount of impurity metal ions. The total amount of electric charge on the second insulating films 142 and 342 also depends on the total amount of charged defects therein.

The electric charge on second insulating films 142 and 342 tends to induce electric charge of the opposite polarity in the vicinity of the surfaces 11S and 31S of the wells 11 and 31 which face the gate insulating films 14 and 34. Thus, the energy bands for the wells 11 and 31 bend in the vicinity of the gate insulating films 14 and 34, causing flat-band potential shifts. From Poisson's equation, the amount (magnitude) of shift JΔV can be approximately estimated at:

$$\Delta V \approx \{\rho \times t^2 / (2 \times \epsilon 0 \times \epsilon r)\} \quad (1)$$

where ρ is the fixed charge density (i.e., the charged defect density) in the high-permittivity dielectric film, t is the thickness of the high-permittivity dielectric film, ϵ0 is the dielectric constant of vacuum, and ϵr is the relative dielectric constant of the high-permittivity dielectric film. That is, the amount of shift ΔV is roughly equal to a value obtained by dividing the product of the charged defect density ρ and the square of the thickness t by the product of the dielectric constant of vacuum ϵ0, the relative dielectric constant ϵr of the high-permittivity dielectric film and the value 2.

It can be estimated from Equation (1) that about 1 at % of charged defects would cause the flat-band potential to shift by about 0.1 to 1.0 V, resulting in comparable shifts of the threshold voltages (hereinafter referred to as "threshold values") of the MOSFETs.

Since it is found from Equation (1) that the amount of voltage shift ΔV is proportional to the square of the film thickness t, the amount of shift ΔV increases more pronouncedly with increasing thicknesses of the second insulating films 142 and 342. Such variations in the amount of shift ΔV, however, are difficult to accomplish by conventional threshold-voltage control methods for MOSFETs which comprise ultra thin silicon oxide films.

Figures 3, 4:
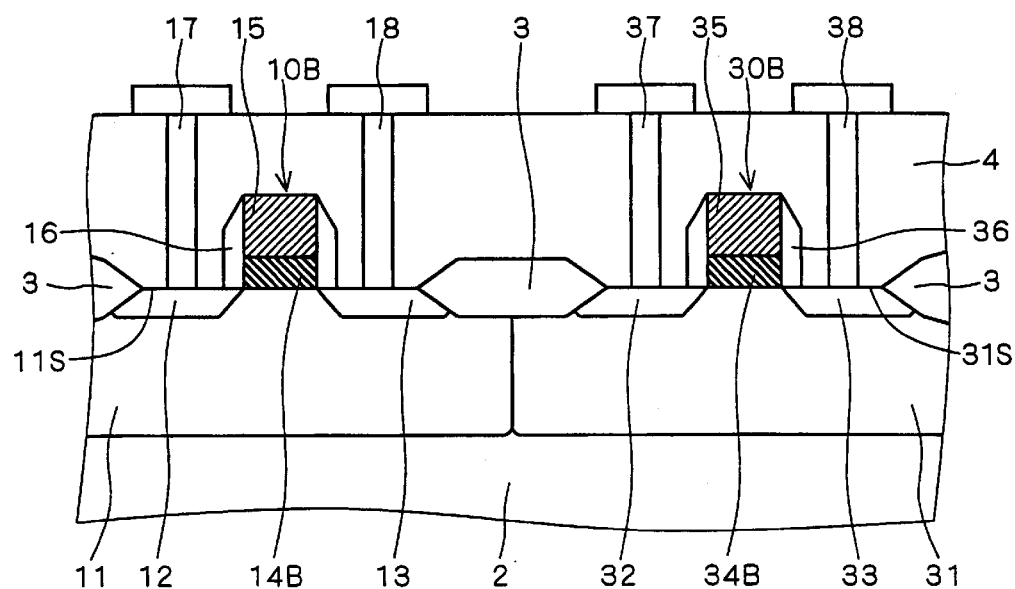
FIG. 4 is a schematic cross-sectional view of a semiconductor device according to a second preferred embodiment.

FIGS. 2 and 3 are explanatory diagrams of the relationship (experimental result) between the dopant concentrations of impurity metal ions in the second insulating films 142 and 342 and the threshold voltages of the MOSFETs 10 and 30. As a prerequisite for FIGS. 2 and 3, in the semiconductor device 1, silicon oxide films of 1.5 nm thickness are used for the first insulating films 141 and 341. The second insulating films 141 and 341 are Al$_2$O$_3$ films of 3 nm thickness doped with Sr which is in stable oxidation state when bivalent (see FIG. 2) or with Zr which is in stable oxidation state when quadrivalent (see FIG. 3), by ion implantation. The Al$_2$O$_3$ films are deposited by CVD, implanted with ions as above described, and oxidized in an atmosphere of oxygen, whereby the second insulating films 142 and 342 are formed. The gate electrodes 15 and 35 have multilayered structures consisting of highly phosphorus-doped polycrystalline silicon of 100 nm thickness and cobalt silicide of 200 nm thickness. The dopant concentrations are measured by SIMS (secondary ion mass spectroscopy) and XRF (X-ray fluorescence).

As shown in FIGS. 2 and 3, when not doped with impurity metal ions, the nMOSFET 10 has a threshold voltage of 0.32 V and the pMOSFET 30 has a threshold voltage of −0.61 V. Referring to FIG. 2, when the dopant concentrations of Sr ions are 0.03 at %, 0.10 at %, 0.3 at %, 1 at %, 3 at %, and 10 at %, the threshold values of the nMOSFET 10 are 0.33 V, 0.36V, 0.42 V, 0.54 V, 0.70 V, and 0.71 V, respectively, and the threshold values of the pMOSFET 30 are −0.60 V, −0.57V, −0.51 V, −0.39V, −0.23 V, and −0.22 V, respectively. Referring to FIG. 3, when the dopant concentrations of Z ions are 0.03 at %, 0.10 at %, 0.3 at %, 1 at %, 3 at %, and 10 at %, the threshold voltages of the nMOSFET 10 are 0.31 V, 0.28V, 0.22 V, 0.10 V, −0.05 V, and −0.06 V, respectively, and the threshold voltages of the pMOSFET 30 are −0.62 V, −0.65 V, −0.71 V, −0.83 V, −0.96 V, and −0.97 V, respectively.

By doping in this way the high-permittivity dielectric films (in this case, the Al$_2$O$_3$ films) as the primary materials of the second insulating films 142 and 342 with impurity metal ions or, in other words, by controlling the charged defect densities in the high-permittivity dielectric films, the threshold voltages of the nMOSFET 10 and the pMOSFET 30 can be controlled. It is found from FIGS. 2 and 3 that when the concentrations of impurity metal ions (dopant) are in the range of 0.1 at % to 10 at %, the threshold voltages can be increased depending on the dopant concentrations. Especially, the dopant concentrations of 0.3 at % to 3 at % are suitable for sufficient changes in practice.

The threshold voltages also depend on the thicknesses of the first insulating films 141 and 341. While the first insulating films 141 and 341 have a thickness of 1.5 nm in the semiconductor device 1 manufactured for FIGS. 2 and 3, for example when the first insulating films 141 and 341 are 3 nm thick, the threshold values of FIGS. 2 and 3 will be reduced roughly by half. From this, when the thicknesses of the first insulating films 141 and 341 are set to be not more than 3 nm, preferably 2 nm or less, as has been previously described, threshold voltage shifts or, in other words, controllability on the threshold voltages can be brought to the practical level.

At this time, the threshold voltages of the nMOSFET 10 and the pMOSFET 30 can be controlled and determined independently by controlling the densities and polarities of charged defects in the second insulating films 142 and 342 by doping using impurity metal ions. The semiconductor device 1 can thus provide consistency between the threshold voltages of the nMOSFET 10 and the pMOSFET 30 both constituting a CMOS device (i.e., the absolute values of the threshold voltages can be set to be about the same value with their polarities reversed).

Referring to FIG. 3, when Al$_2$O$_3$ containing trivalent Al ions is doped with more quadrivalent Zr ions, the threshold voltage of the nMOSFET 10 can be reduced. This is because such Zr-ion doping produces positively charged defects in Al$_2$O$_3$ and thereby the energy band in the vicinity of the surface 11S of the p-wall 11 is bent toward a direction (tendency) to induce electrons (which are carriers for the nMOSFET 10). Consequently, an inversion layer is more likely to be formed, which results in threshold voltage reduction. On the other hand, FIG. 2 shows that the threshold voltage of the nMOSFET 10 can be increased by doping $Al_2O_3$ with more bivalent Sr ions to generate negatively charged defects therein.

Similarly, referring to FIG. 2, the absolute threshold value of the pMOSFET 30 can be reduced by doping using bivalent Sr ions to generate more negatively charged defects. On the other hand, it is found from FIG. 3 that the threshold voltage of the pMOSFET 30 can be increased by doping using quadrivalent Zr ions to generate more positively charged defects.

Here, additional experiments and studies have clearly shown that similar results can be achieved even by using any of the aforementioned materials other than $Al_2O_3$ as the primary material for the film and/or by using any of the aforementioned impurity metal ions other than Sr and Zr. The relationship between the impurity concentrations and the threshold voltages in such cases is nearly identical to that shown FIGS. 2 and 3.

From the viewpoint of reducing the threshold voltages, when doping is performed on both the second insulating films 142 and 342, it is desirable that (i) the second insulating film 142 of the nMOSFET 10 should be doped with impurity metal ions having a valence number higher than metal ions contained in the high-permittivity dielectric film of the primary material, in concentrations of not less than that for the second insulating film 342 of the pMOSFET 30. In other words, (I) the threshold voltage of the nMOSFET 10 can be reduced by generating more positively charged defects in the second insulating film 142 of the nMOSFET 10 thereby to charge the second insulating film 142 more positively.

When doping is performed on both the second insulating films 142 and 342, it is also desirable that (ii) the second insulating film 342 of the pMOSFET 30 should be doped with impurity metal ions having a valence number smaller than metal ions contained in the high-permittivity dielectric film of the primary material, in concentrations of not less than that for the second insulating film 142 of the nMOSFET 10. In other words, (II) the threshold value (absolute threshold value) of the pMOSFET 30 can be reduced by generating more negatively charged defects in the second insulating film 342 of the pMOSFET 30 thereby to charge the second insulating film 342 more negatively.

More specifically, for example in the case of FIGS. 2 and 3, when the second insulating film 342 of the pMOSFET 30 is doped with about 3 at % of Sr ions while no doping is performed on the second insulating film 142 of the nMOSFET 10, threshold voltage reduction can be achieved with consistency between the threshold values of the nMOSFET 10 and the pMOSFET 30.

Alternatively, the occurrence of charged defects in the high-permittivity dielectric films may be caused by doping with two or more kinds (types) of impurity metal ions. For example, $Al_2O_3$ containing trivalent Al ions may be doped with both bivalent Sr and Ba ions or may be doped with both bivalent Sr ions and quadrivalent Zr ions.

When doping uses impurity metal ions having different valence numbers, both positively and negatively charged defects occur in the high-permittivity dielectric film; therefore, the state of charged defects in the high-permittivity dielectric film as a whole can be obtained by offsetting both the positively and negatively charged defects.

That is, the polarity of the high-permittivity dielectric film as a whole corresponds to the positively or negatively charged defects, whichever is greater in number, and the amount of charged defects in the high-permittivity dielectric film as a whole corresponds to a difference in amount between the positively and negatively charged defects. At this time, the charged state of the high-permittivity dielectric film as a whole can be considered to correspond to the state of charged defects after being offset.

Even when doping uses two or more kinds (types) of impurity metal ions, by setting the dopant concentration of each kind of impurity metal ions so as to simultaneously satisfy the aforementioned two conditions (i) and (ii), i.e., (I) and (II), voltage reduction can be achieved with consistency between the threshold voltages of both the MOSFETs 10 and 30.

Now, if materials having a great work function, such as Al, Pt, or TiN, are used for the gate electrode 15P in the conventional nMOSFET 10P, the threshold voltage of the nMOSFET 10P is increased. In the semiconductor device 1, on the other hand, the results of experiments and studies indicate that even if such materials as Al are used for the gate electrode 15, the presence of the second insulating film 142 enables threshold voltage reduction since it is doped with metal ions such as Ti, Zr, Hf, Si, or Pr which have a valence number greater than Al or the like when in stable oxidation state.

In the semiconductor device 1, doping with impurity metal ions produces differences in the density and polarity of charged defects between the second insulating films 142 and 342. Thereby the second insulating films 142 and 342 of the gate insulating films 14 and 34 are in different charged states (including the amount and polarity of electric charge). Therefore, even if the gate electrodes 15 and 35 of the MOSFETs 10 and 30 are made of the same material, i.e., have the same work function (as in the conventional semiconductor device 1P), it is possible to independently control the state of the energy band of the substrate 2 (or the p-well 11) in the vicinity of the gate insulating film 14 and the state of the energy band of the substrate 2 (or the n-well 31) in the vicinity of the gate insulating film 34. Accordingly, the threshold voltages of the nMOSFET 10 and the pMOSFET 30 can be controlled independently.

At this time, in the semiconductor device 1, boron penetration in the gate electrodes (polycrystalline silicon) and channel leakage due to doping of the channel regions are suppressed, as compared with those in the conventional semiconductor device 1P. Therefore, as compared with the conventional semiconductor device 1P, the semiconductor device 1 can control the threshold voltages of the MOSFETs 10 and 30 over a wider voltage range with greater accuracy (in consideration of unintentional changes in threshold value).

When impurity metal ions are of the same concentration, the total amounts of electric charge on the second insulating films 142 and 143 increase with increasing thicknesses thereof. The threshold values can thus be controlled over a further wider voltage range. However, such an increase in the amount of electric charge also increases parasitic capacitances between the gate electrodes 15, 35 and the impurity layers 12, 13, 32, 33. In this regard, in the semiconductor device 1, the thicknesses of the second insulating films 142 and 342 are set to the aforementioned range of 3 to 15 nm in order to achieve controllability on the threshold values and to acquire practical transistor characteristics. Preferably, the thicknesses should be set to between 3 nm and 10 nm so that the parasitic capacitances are comparable to those for the conventional gate insulating films 14P and 34P composed of silicon oxide films.

When the temperature in processes subsequent to the formation of the channel regions (i.e., the formation of the gate insulating films 14, 34 and the impurity layers 12, 13, 32, 33) is about 600° C. or less or when the interfaces between the dielectrics constituting the second insulating films 142, 342 and the wells 11, 31 are thermally stable (i.e., high-permittivity dielectric materials which are resistant to the wells 11 and 31 are used for the second insulating films 142 and 342), the second insulating films 142 and 342 may be formed directly on the wells 11 and 31 without forming the first insulating films 141 and 341 (see FIG. 4 described later.) In such a case, the whole gate insulating films 14 and 34 are equivalent to the second insulating films 142 and 342.

While in the foregoing description, both the second insulating films 142 and 342 are made of the same high-permittivity dielectric material, they may be made of different high-permittivity dielectric materials. In such a case, the amount of shift $\Delta V$ also depends on a difference in relative dielectric constant between the high-permittivity dielectric films (cf. Equation (1)). Using the same high-permittivity dielectric material simplifies the manufacture of the semiconductor device 1.

The foregoing description applies to the nMOSFET 10 and the pMOSFET 30 which have different threshold values (absolute threshold values); therefore, it is also applicable to nMOSFETs and pMOSFETs which do not constitute a CMOS.

<Second Preferred Embodiment>

FIG. 4 illustrates a schematic cross-sectional view of a semiconductor device 1B according to a second preferred embodiment. In the following description, components similar to those of the aforementioned semiconductor device 1 (cf. FIG. 1) are denoted by the same reference numerals and the same description is used for reference.

As shown by comparison of FIG. 4 with FIG. 1, the semiconductor device 1B has such a configuration that in the semiconductor device 1, the second insulating films 142 and 342 are formed directly on the wells 11 and 31, respectively, without the formation of the first insulating films 141 and 341, i.e., the whole gate insulating films 14 and 34 are equivalent to the second insulating films 142 and 342.

More specifically, the semiconductor device 1B comprises an nMOSFET 10B and a pMOSFET 30B, instead of the nMOSFET 10 and the pMOSFET 30 and constitutes a basic CMOS device like the semiconductor device 1.

The nMOSFET 10B in the semiconductor device 1B has such a configuration that the gate insulating film 14 of the previously described nMOSFET 10 (cf. FIG. 1) is modified into a single-layer gate insulating film 14B. Similarly, the pMOSFET 30B in the semiconductor device 1B has such a configuration that the gate insulating film 34 of the previously described pMOSFET 30 (cf. FIG. 1) is modified into a single-layer gate insulating film 34B. That is, the semiconductor device 1 has a multilayered structure consisting of the wells 11 and 31/the single-layer gate insulating films 14B and 34B/the gate electrodes 15 and 35.

Especially, the single-layer gate insulating films 14B and 34B are equivalent to the second gate insulating films 142 and 342 of the gate insulating films 14 and 34 in FIG. 1 and thus are formed in a manner similar to that forming the second gate insulating films 142 and 342. More specifically, the gate insulating films 14B and 34B as a whole are primarily made of the previously described high-permittivity dielectric films having a relative dielectric constant of 8 or more, and at least one of the high-permittivity dielectric films constituting the gate insulating films 14B and 34B is doped with impurity metal ions. The types of high-permittivity dielectric films and impurity metal ions, the dopant concentrations, and the like are selected and determined in the same manner as for the second insulating films 142 and 342 of FIG. 1. Due to this doping, at least one of the density and polarity of charged defects differs between the high-permittivity dielectric films constituting the gate insulating films 14B and 34B. The other components of the semiconductor device 1B are identical to those of the semiconductor device 1.

FIGS. 5 and 6 are explanatory diagrams of the relationship (experimental results) between the dopant concentrations of metal ions in the gate insulating films 14B and 34B and the threshold voltages of the MOSFETs 10B and 30B. As a prerequisite for FIGS. 5 and 6, in the semiconductor device 1B, $ZrO_2$ films of 5 nm thickness doped with Y ions which are in stable oxidation state when trivalent (see FIG. 5) or with Ta ions which are in stable oxidation state when quinquevalent (see FIG. 6) are used for the gate insulating films 14B and 34B. The impurity-doped $ZrO_2$ films are formed by the MOCVD method. For example, the Y-doped $ZrO_2$ film is formed by adding yttrium tris-tetramethylheptanedionate (also referred to as "Y(thd)") to zirconium tris-isopropoxy tetramethylheptanedionate (also referred to as "Zr (OPr$^i$)$_3$(thd)") as a raw material of $ZrO_2$ (or a supply source of Zr ions). The Ta-doped $ZrO_2$ film is formed for example by adding tantalum pentaethoxide (also referred to as "Ta(OPT)$_5$") to the above Zr(OPr$^i$)$_3$(thd). The gate electrodes 15 and 35 each are multiple layers of 30 nm thick TiN and 50 nm thick W.

As shown in FIGS. 5 and 6, when not doped with impurity metal ions, the nMOSFET 10B has a threshold value of 0.46 V and the pMOSFET 30 has a threshold value of −0.49 V. Referring to FIG. 5, when the dopant concentrations of Y ions are 0.03 at %, 0.10 at %, 0.3 at %, 1 at %, 3 at %, and 10 at %, the threshold values of the nMOSFET 10B are 0.47 V, 0.49 V, 0.55 V, 0.68 V, 0.80 V, and 0.80V, respectively, and the threshold values of the pMOSFET 30B are −0.48 V, −0.47 V, −0.40 V, −0.24 V, −0.10 V, and −0.09 V, respectively. Referring to FIG. 6, when the dopant concentrations of Ta ions are 0.03 at %, 0.10 at %, 0.3 at %, 1 at %, 3 at %, and 10 at %, the threshold values of the nMOSFET 10B are 0.45 V, 0.39 V, 0.35 V, 0.26 V, 0.10 V, and 0.09 V, respectively, and the threshold values of the pMOSFET 30B are −0.49 V, −0.56 V, −0.62 V, −0.70 V, −0.86 V, and −0.85 V, respectively.

By doping in this way the high-permittivity dielectric films (in this case, the $ZrO_2$ films) primarily constituting the gate insulating films 14B and 34B with impurity metal ions, i.e., by controlling the density of charged defects in the high-permittivity dielectric films, the threshold voltages of the nMOSFET 10B and the pMOSFET 30B can be controlled and determined independently, as for the previously described nMOSFET 10 and pMOSFET 30. Accordingly, the semiconductor device 1B can achieve effects similar to those of the semiconductor device 1.

As seen from FIGS. 5 and 6, when the gate insulating film 34B of the pMOSFET 30B is doped with about 1 at % of Y ions and the gate insulating film 14B of the nMOSFET 10B is doped with about 1 at % of Ta ions, both the threshold values of the pMOSFET 30B and the nMOSFET 10B can be reduced with consistency therebetween.

Additional experiments and studies have clearly shown that similar results can be achieved even by using any of the previously described materials other than $ZrO_2$ as the primary material for the film and/or by using any of the previously described impurity metal ions other than Y and Ta. The relationship between the impurity concentrations and the threshold voltages in such a case is nearly identical to that of FIGS. 5 and 6.

In order to prevent the surface of the channel regions, low-permittivity dielectric films similar to the first insulating films 141 and 341 of the MOSFETs 10 and 30 in FIG. 1 may be provided between the gate insulating films 14B, 34B and the wells 11, 31.

<Third Preferred Embodiment>

While in the first and second preferred embodiments, the semiconductor devices 1 and 1B comprise a CMOS device, a third preferred embodiment gives a case where the threshold-value control method for the semiconductor devices 1 and 1B is applied to a system LSI. The system LSI comprises MOSFETs (or MISFETs) for logic circuit, for memory cell, and for I/O circuit, each MOSFET having a different threshold value.

Figure 7:
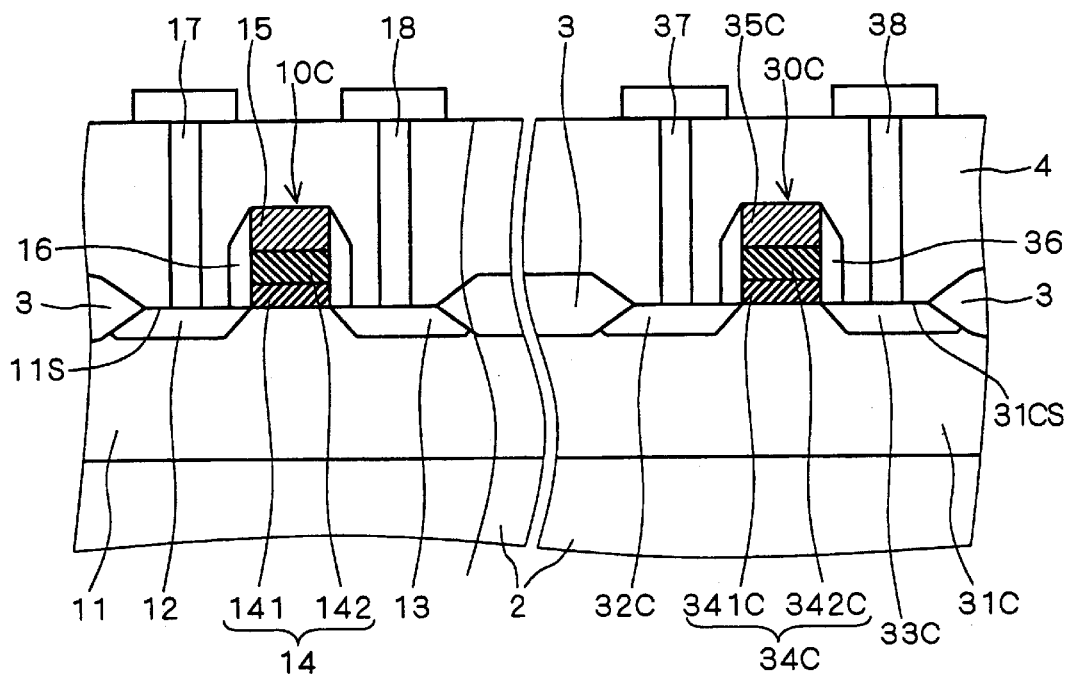
FIG. 7 is a schematic cross-sectional view of a semiconductor device according to a third preferred embodiment.

FIG. 7 illustrates a schematic cross-sectional view of a semiconductor device 1C according to the third preferred embodiment. In FIG. 7, a first nMOSFET (or first MISFET) 10C as a MOSFET for logic circuit and a second nMOSFET (or second MISEET) 30C as a MOSFET for I/O circuit are illustrated.

The first nMOSFET 10C is similar in configuration to the nMOSFET 10 of FIG. 1. The second nMOSFET 30C has basically a similar configuration to that of the first nMOSFET 10C. More specifically, like the first nMOSFET 10C, the second nMOSFET 30C comprises a first insulating film 341C, a second insulating film 342C, and a gate electrode 35C formed in this order on a surface 31CS of a p-well 31C. The first insulating film 341C and the second insulating film 342C form a gate insulating film 34C. The second nMOSFET 30C further comprises n-type impurity layers 32C and 33C (making source/drain regions) formed in the surface 31CS of the p-well 31C.

The second insulating films 142 and 342C are primarily made of the previously described high-permittivity dielectric films having a relative dielectric constant of 8 or more, and at least one of the second insulating films 142 and 342C is doped with the previously described impurity metal ions as in the semiconductor device 1. By this doping, the density and polarity of charged defects in each of the high-permittivity dielectric films, and accordingly the threshold values of the nMOSFETs 10C and 30C, are controlled. Although the first and second nMOSFETs 10C and 30C are of the same channel type, the threshold value of the second nMOSFET 30C for I/O circuit is set to be higher than that of the first nMOSFET 10C for logic circuit. The other components of the semiconductor device 1C are identical to those of the semiconductor device 1.

In this fashion, the semiconductor device 1C can independently control the threshold values of the MOSFETs 10C and 30C of the same channel type and therefore the MOSFETs 10C and 30C can have different threshold values. That is, the semiconductor device 1C can achieve the same effect as the first semiconductor device 1. The above description is also applicable to in a case where the first and second nMOSFETs 10C and 30C are both replaced with pMOSFETs. Further, the relationship between the first and second nMOSFETs 10C and 30C is applicable to that between MOSFETs for memory cell and for I/O circuit and that between MOSFETs for logic circuit and for memory cell.

<Fourth Preferred Embodiment>

While in the first through third preferred embodiments, the MOSFETs 10, 30, 10B, 30B, 10C, and 30C in the semiconductor devices 1, 1B, and 1C comprise the gate insulating films 14, 34, 14B, 34B, 14, and 34C each including a high-permittivity dielectric film, the aforementioned threshold-value control method is also applicable to any one of a plurality of MOSFETs in a semiconductor device.

Figure 8:
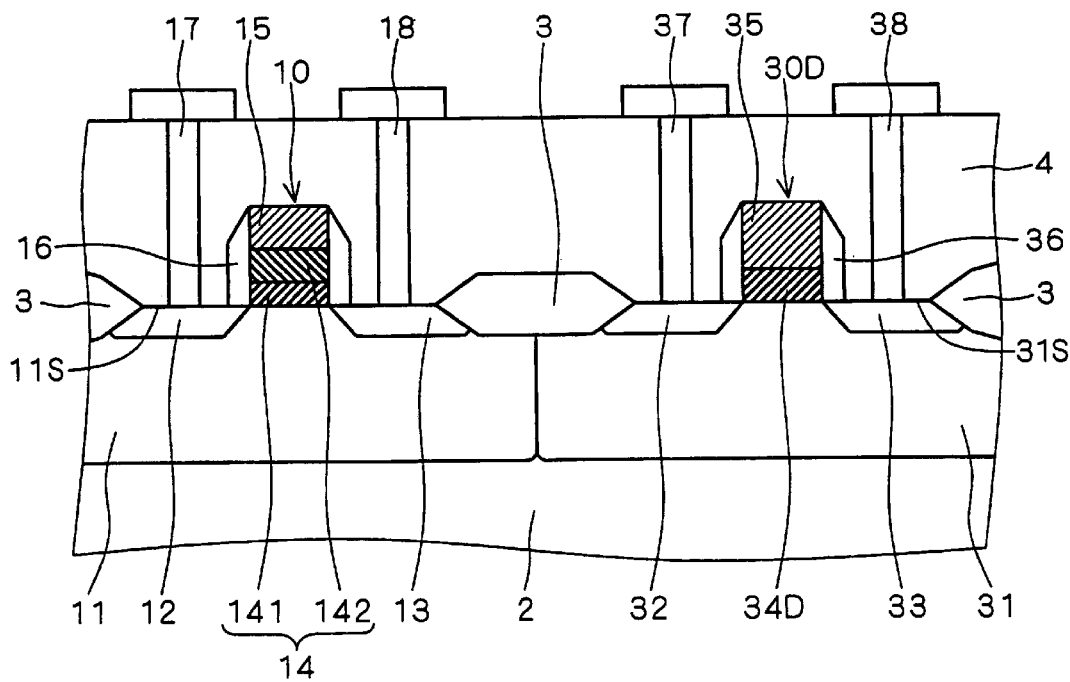
FIG. 8 is a schematic cross-sectional view of a semiconductor device according to a fourth preferred embodiment.
Figure 9:
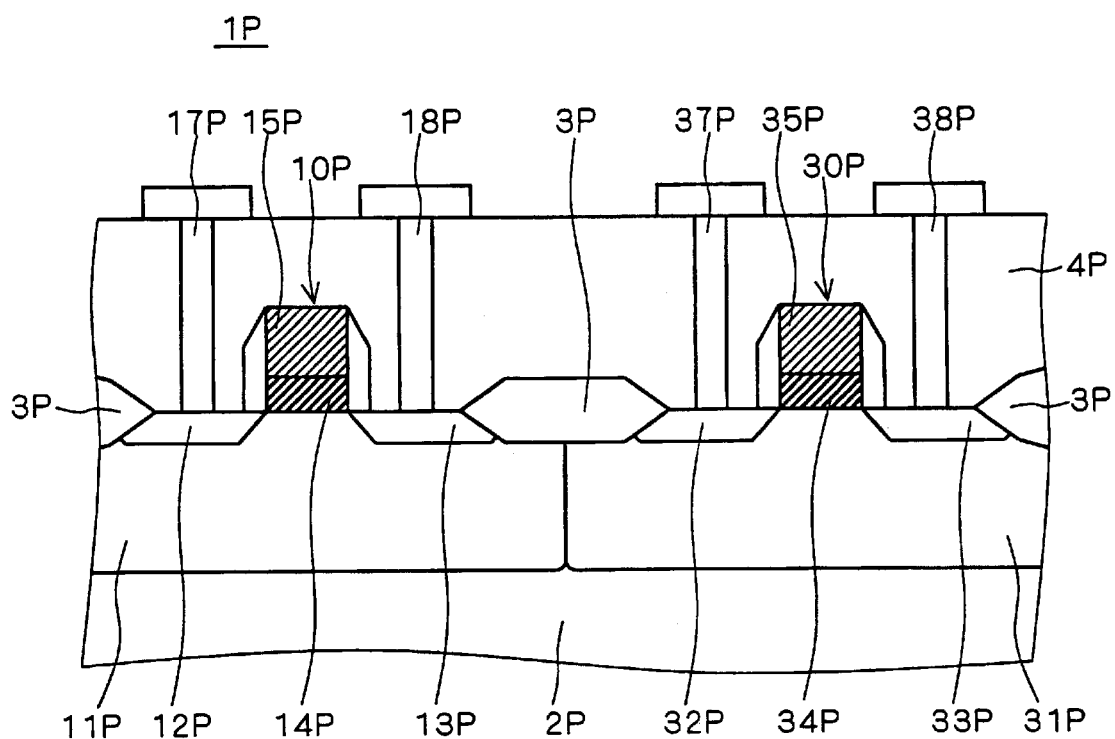
FIG. 9 is a schematic cross-sectional view of a conventional semiconductor device.

FIG. 8 illustrates a schematic cross-sectional view of a semiconductor device 1D according to a fourth preferred embodiment. The semiconductor device 1D comprises the previously described nMOSFET 10 and a pMOSFET (or second MISFET) 30D. A gate insulating film 34D of the pMOSFET 30D is composed of a dielectric film having a low (relative) dielectric constant such as a silicon oxide film including a thermal oxide film, or a silicon nitride film, or a silicon oxynitride film which is a combination of the silicon oxide film and the silicon nitride film. The other components of the pMOSFET 30D and the semiconductor device 1D are identical to those of the pMOSFET 30 and the semiconductor device 1, respectively.

By controlling at least one of the density and polarity of charged defects in the high-permittivity dielectric film constituting the second insulating film 142 of the nMOSFET 10, the semiconductor device 1D can produce a difference in threshold value between the nMOSFET 10 and the pMOSFET 30D. The semiconductor device 1D can thus achieve the same effect as the semiconductor device 1. Alternatively, the pMOSFET 30D may be replaced with an nMOSFET, or the nMOSFET 10 may be replaced with the pMOSFET 30 (cf. FIG. 1).

Like the semiconductor devices 1, 1B, 1C, and 1D, semiconductor devices which comprise three or more MOSFETs can also independently control the threshold values of their MOSFETs.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor substrate;

a first MISFET including a first gate insulating film formed on said semiconductor substrate, wherein said first gate insulating film includes, at least in part, a first dielectric film containing first metal ions and having a relative dielectric constant of 8 or more; and a second MISFET including a second gate insulating film formed on said semiconductor substrate, wherein said second gate insulating film includes, at least in part, a second dielectric film containing second metal ions and having a relative dielectric constant of 8 or more;

wherein first doping is performed on said first dielectric film using at least one kind of first impurity metal ions whose valence number differs by 1 from that of said first metal ions, and second doping is performed on said second dielectric film using at least one kind of second impurity metal ions whose valence number differs by 1 from that of said second metal ions, wherein at least one of the type and concentration differs between the first impurity metal ions and the second impurity metal ions, wherein due to said first and second doping, at least one of the density and polarity of charged defects differs between said first dielectric film and said second dielectric film, and wherein a threshold voltage difference between said first MISFET and said second MISFET is accomplished.

2. The semiconductor device according to claim 1, wherein:

said first dielectric film and said second dielectric film are made of the same material.

3. The semiconductor device according to claim 2, wherein:

said first MISFET includes an n-type channel, said second MISFET includes a p-type channel, said at least one kind of first impurity metal ions includes third metal ions having a valence number greater than said first metal ions, said at least one kind of second impurity metal ions includes fourth metal ions having a valence number greater than said second metal ions, and when said first doping and said second doping are both performed, a concentration of said third metal ions is set to be not less than that of said fourth metal ions.

4. The semiconductor device according to claim 2, wherein:

said first MISFET includes an n-type channel, said second MISFET includes a p-type channel, said at least one kind of first impurity metal ions includes fifth metal ions having a valence number smaller than said first metal ions, said at least one kind of second impurity metal ions includes sixth metal ions having a valence number smaller than said second metal ions, and when said first doping and said second doping are both performed, a concentration of said fifth metal ions is set to be not more than that of said sixth metal ions.

5. The semiconductor device according to claim 3, wherein:

said first MISFET includes an n-type channel, said second MISFET includes a p-type channel, said at least one kind of first impurity metal ions includes fifth metal ions having a valence number smaller than said first metal ions, said at least one kind of second impurity metal ions includes sixth metal ions having a valence number smaller than said second metal ions, and when said first doping and said second doping are both performed, a concentration of said fifth metal ions is set to be not more than that of said sixth metal ions.

6. The semiconductor device according to claim 2, wherein:

said first and second MISFETs include channels of a same type, said at least one kind of first impurity metal ions includes third metal ions having a valence number greater than said first metal ions, said at least one kind of second impurity metal ions-includes fourth metal ions having a valence number greater than said second metal ions, and when said first doping and said second doping are both performed, a concentration of said third metal ions is set to be not less than that of said fourth metal ions.

7. The semiconductor device according to claim 2, wherein:

said first and second MISFETs include channels of a same type, said at least one kind of first impurity metal ions includes fifth metal ions having a valence number smaller than said first metal ions, said at least one kind of second impurity metal ions includes sixth metal ions having a valence number smaller than said second metal ions, and when said first doping and said second doping are both performed, a concentration of said fifth metal ions is set to be not more than that of said sixth metal ions.

8. The semiconductor device according to claim 6, wherein:

said first and second MISFETs include channels of a same type, said at least one kind of first impurity metal ions includes fifth metal ions having a valence number smaller than said first metal ions, said at least one kind of second impurity metal ions includes sixth metal ions having a valence number smaller than said second metal ions, and when said first doping and said second doping are both performed, a concentration of said fifth metal ions is set to be not more than that of said sixth metal ions.

9. The semiconductor device according to claim 1, wherein:

materials of said first and second dielectric films each include at least one of $Al_2O_3$, $Y_2O_3$, and $La_2O_3$, and said at least one kind of first impurity ions and said at least one kind of second impurity ions each include at least one of Ba, Sr, Mg and Ca bivalent ions, and Ti, Zr, Hf, Si, and Pr quadrivalent ions.

10. The semiconductor device according to claim 1, wherein:

materials of said first and second dielectric films each include at least one of $TiO_2$, $ZrO_2$, $HfO_2$, and $PrO_2$, and said at least one kind of first impurity metal ions and said at least one kind of second impurity metal ions each include at least one of Al, Y and La trivalent ions, and Ta and Nb quinquevalent ions.

11. The semiconductor device according to claim 1, wherein: a dopant concentration of said at least one kind of first and/or second impurity metal ions is in the range of 0.1 atomic % to 10 atomic %.

12. A semiconductor device comprising:

a semiconductor substrate;

a first MISFET including a first gate insulating film formed on said semiconductor substrate, wherein said first gate insulating film includes, at least in part, a first dielectric film containing predetermined metal ions and having a relative dielectric constant of 8 or more; and a second MISFET including a second gate insulating film formed on said semiconductor substrate, wherein said second gate insulating film includes, at least in part, a second dielectric film;

wherein doping is performed on said first dielectric film using at least one kind of impurity metal ions whose valence number differs by 1 from that of said predetermined metal ions, wherein, due to said doping, at least one of the density and polarity of charged defects differs between said first dielectric film and said second dielectric film, and wherein a threshold voltage difference between said first MISFET and said second MISFET is accomplished by controlling at least one of the density and polarity of charged defects caused by said doping in said first dielectric film.

* * * * *